(12) United States Patent
Gotsmann et al.

(10) Patent No.: US 9,470,583 B1
(45) Date of Patent: Oct. 18, 2016

(54) CALIBRATION-FREE TEMPERATURE MEASUREMENT

(71) Applicant: International Business Machines Corporation, Armonk, NY (US)

(72) Inventors: Bernd W. Gotsmann, Horgen (CH); Volker Schmidt, Pegnitz (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/982,096

(22) Filed: Dec. 29, 2015

(51) Int. Cl.
| | |
|---|---|
| G01K 7/04 | (2006.01) |
| G01K 7/02 | (2006.01) |
| H01L 27/16 | (2006.01) |
| H01L 35/28 | (2006.01) |
| H01L 23/34 | (2006.01) |
| H01L 35/34 | (2006.01) |
| H01L 35/04 | (2006.01) |

(52) U.S. Cl.
CPC ............... *G01K 7/021* (2013.01); *H01L 23/34* (2013.01); *H01L 23/345* (2013.01); *H01L 27/16* (2013.01); *H01L 35/04* (2013.01); *H01L 35/28* (2013.01); *H01L 35/34* (2013.01)

(58) Field of Classification Search
USPC ........................................................ 374/179
See application file for complete search history.

(56) References Cited

U.S. PATENT DOCUMENTS

| 8,169,045 B2 | 5/2012 | Dibra et al. |
| 8,517,605 B2 | 8/2013 | Grayson et al. |
| 8,722,222 B2 | 5/2014 | Kossakovski et al. |
| 2010/0270620 A1* | 10/2010 | Dibra ............. G01K 1/08 257/368 |
| 2012/0013364 A1 | 1/2012 | Schnaitter |
| 2013/0044788 A1* | 2/2013 | Snyder ............ G01K 7/02 374/179 |
| 2013/0049777 A1 | 2/2013 | Wang et al. |

OTHER PUBLICATIONS

Martin, J., "Apparatus for the high temperature measurement of the Seebeck coefficient in thermoelectric materials" Review of Scientific Instruments 83, 065101 (2012); pp. 1-10.
Recktenwald, G., "Conversion of Thermocouple Voltage to Temperature" Mechanical and Material Engineering Department, Portland State University, Jul. 14, 2010, pp. 1-23.

* cited by examiner

*Primary Examiner* — Mirellys Jagan
(74) *Attorney, Agent, or Firm* — Cantor Colburn LLP; Daniel Morris

(57) ABSTRACT

Aspects of the invention include a sensor that senses the absolute temperature of a device, such as an integrated circuit ("IC"). The sensor may be embodied in the IC and have first and second pieces of electrically conductive material each having an intrinsic Seebeck coefficient and a pair of contacts located at proximal and distal ends of the pieces of material. The intrinsic Seebeck coefficients differ between the two pieces of material. At least one heater is disposed at the proximal ends of the first and second pieces material and radiates heat which causes a temperature difference to form across each of the first and second pieces of material, thereby causing a voltage to form across first and second pieces of material. A measure circuit measures the voltage formed across each of the first and second pieces of material and determines an absolute temperature from at least the measured voltages.

20 Claims, 4 Drawing Sheets

CALIBRATION-FREE TEMPERATURE MEASUREMENT

BACKGROUND

The present invention relates to a method and a sensor for the measurement of temperature, and more specifically, to a method and a sensor for the measurement of absolute temperature in which calibration of the sensor is not required prior to the measurement of temperature.

Essentially all physical, chemical, and biological processes depend to some extent on temperature. Devices that employ such temperature-dependent processes often have a range of absolute temperature that is conducive to proper device operation as well as one or more ranges of absolute temperature where proper device operation can foreseeably be ruled out. In some cases, the latter temperature range moreover induces irreversible modifications of general device functionality, such that these temperatures should be avoided. To ensure proper functional operation of the device, it is therefore often desirable to monitor the absolute temperature of the device during device operation and control the temperature and/or device operation such that the potential for any harm to the device due to device operation at improper temperatures is reduced or even eliminated.

This holds true, for example, during the operation of semiconductor devices and, more specifically, for the operation of integrated circuits ("ICs"). For ICs, it can, for example, be desirable to operate the IC at an absolute temperature higher than, e.g., 250K and lower than, e.g., 360K. To ensure IC device operation in this (or some other) desirable temperature range, the absolute temperature of the IC should be measured at least periodically during device operation (e.g., once every second) and utilized in a control type process and/or system that prevents IC device operation in an undesirable temperature range and/or provides some type of corrective action to allow for device operation in a desirable temperature range.

Determining a temperature difference of a device at any particular instance in time during device operation is generally easier than determining the absolute temperature of that device. Consider for instance a resistive temperature sensor, where the temperature-dependent change of a specific resistivity of a material (e.g., platinum) is used to infer the temperature. If the resistance at a first temperature is known, then from a measurement of the resistance at a second temperature the temperature difference between the first and second temperatures can be accurately determined. Yet, using a resistive temperature sensor to measure the absolute temperature of a device inherently necessitates first determining the resistance of the temperature sensor at a known first temperature, i.e., it is typically necessary to calibrate the temperature sensor prior to using it to measure the actual temperature of something.

For devices, e.g., semiconductor integrated circuits, which are typically produced in relatively large numbers, it is impractical from a production efficiency point of view to separately calibrate the temperature sensors attached to or made a part of each one of the separate semiconductor integrated circuits. It is therefore desirable to equip the integrated circuit with a temperature sensor that does not require calibration.

Using a resistance temperature sensor for calibration-free temperature measurement requires that the element (e.g., a platinum strip or a semiconductor diode) which exhibits the temperature-dependent resistance be fabricated such that the resistance variations between different sensors are sufficiently small. Consider for instance a resistance temperature sensor employing a platinum metal strip. At 0° C. the resistance of platinum changes about 0.4% per Kelvin. A calibration-free temperature sensor for determining the absolute temperature to an accuracy of ±5K therefore requires that resistance is known with an accuracy of about ±2%. Fabricating such sensors with resistances varying by less than ±2% from sensor to sensor is challenging; in particular, because the resistance depends on the sensor dimensions (e.g., the platinum film thickness). Thus, it is most often not practical to utilize a resistance temperature sensor for calibration-free temperature measurement, especially in conjunction with temperature measurement of integrated circuits.

SUMMARY

According to an embodiment of the present invention, a sensor includes a first piece of electrically conductive material having an intrinsic Seebeck coefficient, the first piece of electrically conductive material having a pair of contacts, a first one of the contacts located at a proximal end of the first piece of electrically conductive material, a second one of the contacts located at a distal end of the first piece of electrically conductive material. The sensor also includes a second piece of electrically conductive material having an intrinsic Seebeck coefficient that is different than the intrinsic Seebeck coefficient of the first piece of electrically conductive material, the second piece of electrically conductive material having a pair of contacts, a first one of the contacts located at a proximal end of the second piece of electrically conductive material, a second one of the contacts located at a distal end of the second piece of electrically conductive material. The sensor further includes at least one heater disposed adjacent to, or abutting, or on top of the proximal ends of the first and second pieces of electrically conductive material, the heater configured to radiate heat wherein the radiated heat causes a temperature difference to form across each of the first and second pieces of electrically conductive material, thereby causing a voltage to form across each of the first and second pieces of electrically conductive material. Still further, the sensor includes a measure circuit that measures the voltage formed across each of the first and second pieces of electrically conductive material and determines an absolute temperature from at least the measured voltages.

According to another embodiment of the present invention, a method includes providing a first piece of electrically conductive material having an intrinsic Seebeck coefficient, the first piece of electrically conductive material having a pair of contacts, a first one of the contacts located at a proximal end of the first piece of electrically conductive material, a second one of the contacts located at a distal end of the first piece of electrically conductive material. The method also includes providing a second piece of electrically conductive material having an intrinsic Seebeck coefficient that is different than the intrinsic Seebeck coefficient of the first piece of electrically conductive material, the second piece of electrically conductive material having a pair of contacts, a first one of the contacts located at a proximal end of the second piece of electrically conductive material, a second one of the contacts located at a distal end of the second piece of electrically conductive material. The method further includes providing at least one heater disposed adjacent to, or abutting, or on top of the proximal ends of the first and second pieces of electrically conductive material, the heater configured to radiate heat wherein the radiated heat causes a temperature difference to form across each of the first and second pieces of electrically conductive material, thereby causing a voltage to form across each of the first and second pieces of electrically conductive material. Still further, the method includes providing a measure circuit that measures the voltage formed across each of the first and second pieces of electrically conductive material and determines an absolute temperature from at least the measured voltages.

According to yet another embodiment of the present invention, a sensor includes a first piece of electrically conductive material having an intrinsic Seebeck coefficient, the first piece of electrically conductive material having a pair of contacts, a first one of the contacts located at a proximal end of the first piece of electrically conductive material, a second one of the contacts located at a distal end of the first piece of electrically conductive material. The sensor also includes a second piece of electrically conductive material having an intrinsic Seebeck coefficient that is different than the intrinsic Seebeck coefficient of the first piece of electrically conductive material, the second piece of electrically conductive material having a pair of contacts, a first one of the contacts located at a proximal end of the second piece of electrically conductive material, a second one of the contacts located at a distal end of the second piece of electrically conductive material. The sensor further includes at least one heater disposed adjacent to, or abutting, or on top of the proximal ends of the first and second pieces of electrically conductive material, the heater configured to radiate heat wherein the radiated heat causes a temperature difference to form across each of the first and second pieces of electrically conductive material, thereby causing a voltage to form across each of the first and second pieces of electrically conductive material, wherein the voltage formed across each of the first and second pieces of electrically conductive material is indicative of an absolute temperature value provided by the sensor.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
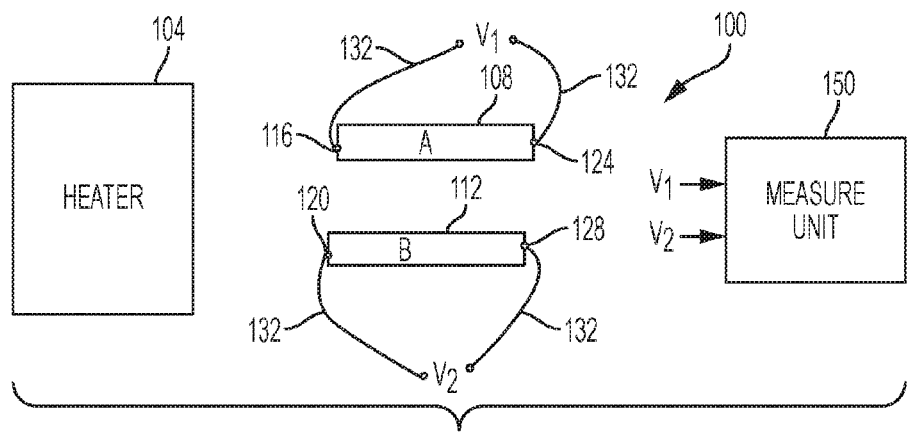
FIG. 1 is a schematic diagram of an absolute temperature sensor in accordance with an embodiment of the present invention.

In embodiments of the present invention, compared to a common type of resistance temperature measurement discussed hereinabove that is part of a temperature measurement of a material, a measurement of the Seebeck coefficient S of a material is different in that the Seebeck coefficient is an intrinsic property of a material and that the Seebeck coefficient is essentially independent of the dimensions or geometry of the temperature sensor. Furthermore, considering a semiconductor material as part of, e.g., an integrated circuit ("IC"), the Seebeck coefficient varies with relatively much less dependence on the doping concentration Nd, because it varies with the logarithm of Nd and does not vary linearly with Nd, as do the resistivity variations of a resistance temperature measurement.

The Seebeck coefficient S of a material can be determined from the voltage difference (i.e., the Seebeck voltage) that arises in a material in response to an imposed temperature difference on that material. The Seebeck coefficient can be determined as the ratio of the Seebeck voltage and the imposed temperature difference. As the Seebeck coefficient is an intrinsic material property, its value can be considered to be known for a specific material or otherwise may be determined once, for a particular sensor, and with sufficient fidelity the Seebeck coefficient may be assumed not to vary between different sensors. As such, the Seebeck coefficient S does not depend on variations of the geometry of the portion of sensor material utilized.

If the Seebeck coefficient S is known and two electrical contacts are made to a material, then the temperature difference between the electrical contacts can be determined by measuring the Seebeck voltage and dividing it by the known Seebeck coefficient of the material.

The absolute temperature can be determined if—upon imposing a temperature difference—the Seebeck voltages obtained from two different materials with known Seebeck coefficients are considered and if furthermore at least one of the two materials exhibits a temperature dependence of the Seebeck coefficient.

A first electrically conductive material (material A) equipped with at least two electrical contacts (contact material is material C) and exposed to a temperature difference or gradient between the two electrical contacts will exhibit a voltage difference V1 between the two electrical contacts. This voltage difference V1 is proportional to the temperature difference between the two electrical contacts with the proportionality constant given by the difference of the Seebeck coefficient SA of the first material A and the Seebeck coefficient SC of the third material C.

Likewise, if at least two electrical contacts (of the same material C) are made to a second electrically conductive material B that furthermore exhibits a temperature difference or gradient between the two electrical contacts, then a voltage difference V2 arises between the two electrical contacts. This voltage difference V2 is proportional to the temperature difference between to two electrical contacts with the proportionality constant given by the difference of the Seebeck coefficient SB of the second material B and the Seebeck coefficient SC of the third material C.

If the temperature difference between the two electrical contacts made to the first material and the two electrical contacts made to the second material is essentially the same, the ratio R of the two Seebeck voltages V1 and V2 is R=V1/V2=(SA−SC)/(SB−SC). Thus, the ratio R of the two Seebeck voltages V1 and V2 is essentially independent of the temperature difference. It will be appreciated by those skilled in the art that imposing the temperature difference DT may lead to a rise of the absolute temperature to be measured by the sensor such that the temperature of the sensor rises to a value between T and T+DT. There are many ways to minimize or to take into account this aspect which are obvious to those skilled in the art.

Furthermore this voltage ratio V1/V2 only depends on the Seebeck coefficients of material A, material B, and material C, and is essentially independent of geometry or dimensions of the sensor material utilized.

If at least one of the two materials (material A or material B) exhibits a Seebeck coefficient that is temperature-dependent and if furthermore the temperature dependence of the Seebeck coefficient SA of material A is different from the temperature dependence of the Seebeck coefficient SB of material B, then the ratio R exhibits a temperature dependence from which the absolute temperature can be determined.

In an embodiment of the present invention, one way to determine absolute temperature is to use tabulated values. For example:

T=Temperature in K;
SA=Seebeck coefficient of material A in microV/K; and
SB=Seebeck coefficient of material B in microV/K.
A resulting exemplary look up table is:

| T | SA | SB | Ratio (R) |
|---|-----|-----|-----------|
| 300 | 200 | 127 | 1.5748 |
| 301 | 199 | 129 | 1.5426 |
| 302 | 198 | 132 | 1.5000 |

Note that in a temperature sensor or sensing circuit, the Seebeck coefficients SA and SB may include the contribution of a third material (i.e., material C used for the wiring contacts) that is also exposed to the temperature gradient. This is true unless the Seebeck coefficients SA and SB are relatively much larger than the Seebeck coefficient SC for the contact material C such that the Seebeck coefficient SC for the contact material C can essentially be ignored in the calculations instead of being taken into account.

The assumptions made for the above are that a situation may be created in which the temperature difference or gradient between the two ends of a piece of material A and a piece of material B is the same. This may be accomplished by the geometry of a heater implemented on the IC or by knowledge of an existing internal heat source within the IC (e.g., a clock circuit). The exact value of the temperature difference, DT, may be unknown. Typically DT is much smaller than the absolute temperature T.

Then the Seebeck voltages measured are:

$V1=SA*DT$; and $V2=SB*DT$; and $V1/V2=R$.

The ratio R of the two Seebeck voltages may then be determined from the measured values of the Seebeck voltages V1 and V2. Further, from this ratio R, the absolute temperature value T can be determined by using the look up table above. This may be done even if DT is not known exactly.

Reasons for using the ratio R for determining the absolute temperature include that the value of R=V1/V2 is easily experimentally accessible, that the value of R is essentially independent of the applied temperature difference between the electrical contacts made to material A and material B, respectively, and that the value of R is essentially independent of the geometry of the portions of material A, material B, or material C.

Embodiments of the absolute temperature sensor of the present invention are not limited to use of a look up table for use in determining the absolute temperature. Other embodiments are contemplated in which the absolute temperature is determined without use of a look up table.

Referring to FIG. 1, there illustrated is a schematic diagram of an absolute temperature sensor 100 in accordance with an embodiment of the present invention. The sensor embodiment shown in FIG. 1 includes a heater 104, and portions 108, 112 of material A and material B, respectively. The heater 104 is located adjacent to the portions 108, 112 of material A and material B in the embodiment shown in FIG. 1. In embodiments of the present invention, material A is different from material B at least from the fact that the Seebeck coefficient of material A is different from the Seebeck coefficient of material B. Also, in embodiments of the present invention, at least two different materials A and B are utilized. However, more than two materials may be utilized in other embodiments. Regardless, of whether two materials are utilized or more than two materials are utilized, is suffices that each material differs from one another at least in the associated Seebeck coefficient for each material.

Figure 7:
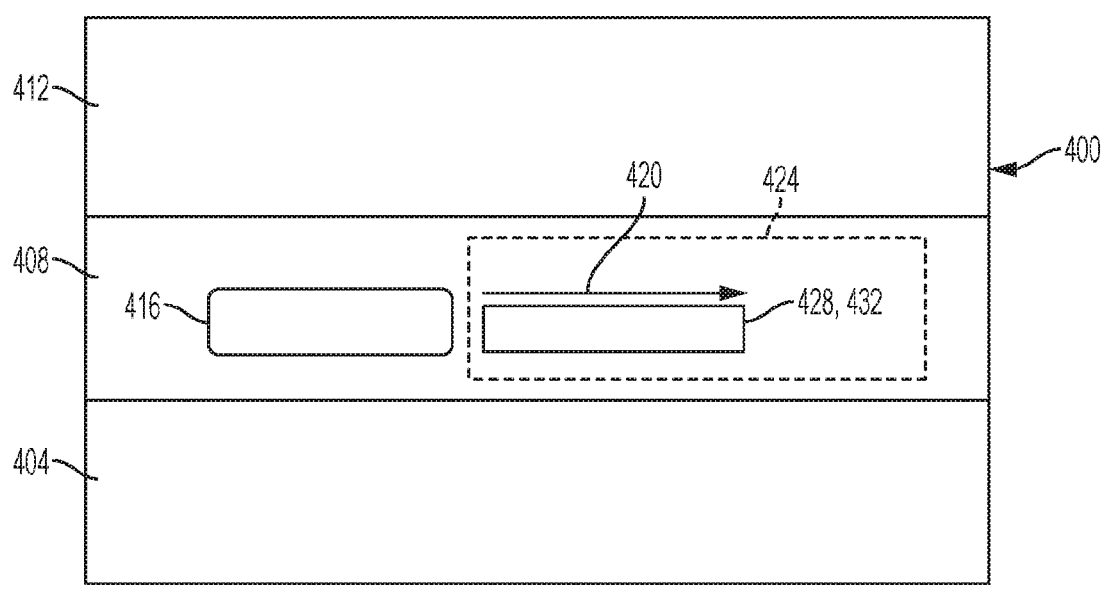
FIG. 7 is a side view of an integrated circuit having an embodiment of the absolute temperature sensor of the present invention similar to the embodiment shown in FIG. 1 implemented within the integrated circuit, in accordance with an embodiment of the present invention.
Figure 8:
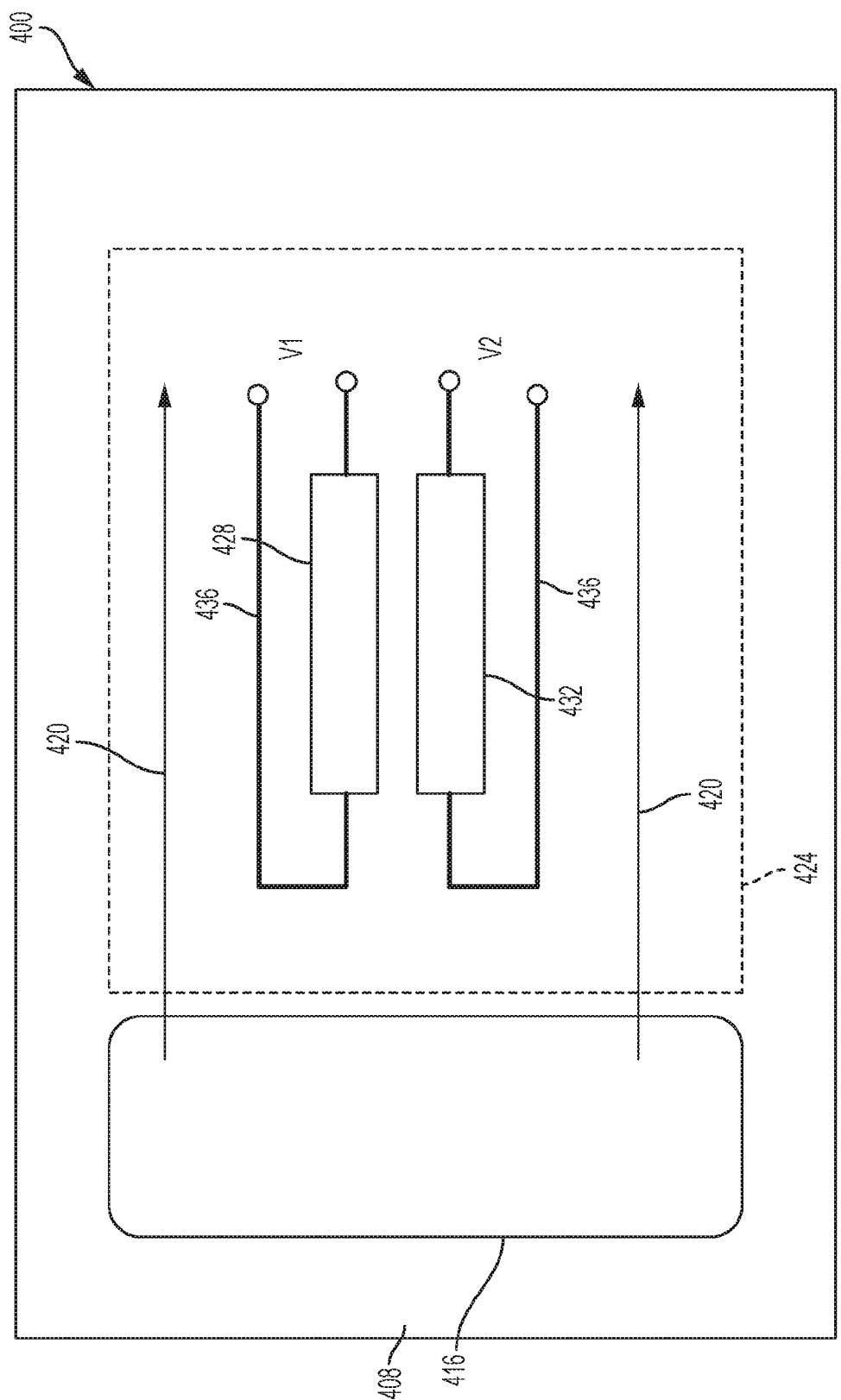
FIG. 8 is a top view of the integrated circuit of FIG. 7, in accordance with an embodiment of the present invention.

The heater 104 (e.g., a microstructured heater), and the portions 108, 112 of material A and material B, may be fabricated, for example, in thin film technology on or within a substrate as part of an IC (FIGS. 7 and 8). The absolute temperature sensor 100 may be utilized to determine the absolute temperature of the IC at one or more points in time during IC device operation. Further, in accordance with other embodiments of the present invention, the absolute temperature sensor 100 may be utilized as part of a type of control system (not shown) that is used to control the temperature of the IC and/or the operation of the IC such that IC device operation in an undesirable temperature range is avoided as best as possible so as to reduce or eliminate the possibility of harm to the IC.

The heater 104 may be fabricated solely for use as part of the sensor 100 in embodiments of the present invention. That is, the heater 104 may comprise a dedicated heat dissipating element installed for radiating heat. In the alternative, the heater 104 may be a device that already exists on the IC for a different function, while giving off heat, such as, for example, a clock circuit.

FIG. 1 shows each portion 108, 112 of material A and material B having a rectangular two-dimensional "stripe" shape, and with a certain three-dimensional thickness. However, it is to be understood that this is purely exemplary. Any suitable shape and thickness of each portion 108, 112 of material A and material B may be utilized in light of the teachings herein.

In an embodiment of the present invention, one of material A or material B may be a lightly doped semiconductor material (e.g., silicon), while the other one of material A or material B may be a metal. Due to the use of these relatively dissimilar materials A and B, the temperature dependence of the Seebeck coefficients of materials A and B differ to a relatively sufficient extent for purposes of embodiments of the present invention.

As shown in FIG. 1, one first, proximal end of each of the portions 108, 112 of material A and material B (i.e., the left end as shown in FIG. 1) may be located relatively closer or adjacent to the heater 104 than the corresponding second, distal end (i.e., the right end as shown in FIG. 1) of each of the portions 108, 112 of material A and material B. The first, proximal end of each portion 108, 112 of material A and material B is equipped with a first electrical contact 116, 120, respectively, while the second distal end of each portion 108, 112 of material A and material B is equipped a second electrical contact 124, 128, respectively. As such, the voltages V1 and V2 can be measured between the first and second contacts 116, 124 and 120, 128, as indicated in FIG. 1, for each corresponding portion 108, 112 of material A and material B. Material C may comprise the material of the electrically conductive (e.g., metallic) wiring 132 making connection to the contacts 116, 124 and 120, 128 of material A and material B, respectively. Often, the Seebeck coefficient SC of material C (e.g., tungsten) is relatively small compared to the Seebeck coefficients SA of material A and SB of material B and, thus, the value of SC may be ignored when determining the absolute temperature, as discussed hereinafter.

By utilizing the heater 104 to radiate heat which heats the IC (i.e., the components of the absolute temperature sensor 100), a temperature difference or gradient between the first (proximal) end and the second (distal) end of each of the portions 108, 112 of material A and material B can be created, which in turn induces the voltages V1 and V2, respectively, between the contacts 116, 124 and 120, 128. From these voltages, the ratio R=V1/V2=(SA−SC)/(SB−SC) can be computed. If at least one of the known Seebeck coefficients SA or SB exhibits a temperature dependence and if SA differs from SB, then the ratio R can be used to determine the absolute temperature, as described hereinabove.

According to embodiments of the present invention, FIG. 1 also illustrates a measure unit 150 that may be formed as part of the IC that contains the absolute temperature sensor 100. In the alternative, the measure unit 150 may be separate from the IC that contains the absolute temperature sensor 100. The measure unit 150 may comprise, for example, a processor and a memory, and may have as inputs the two temperature induced voltages V1 and V2. In an embodiment of the present invention, the measure unit 150 may use the voltages V1 and V2 to calculate or otherwise determine the absolute temperature of the IC using the relationships, look up table and equations described hereinabove, or using some other method. The processor may be programmed to operate accordingly using software, and the memory may contain the look up table and the software instructions for the processor.

Figure 2:
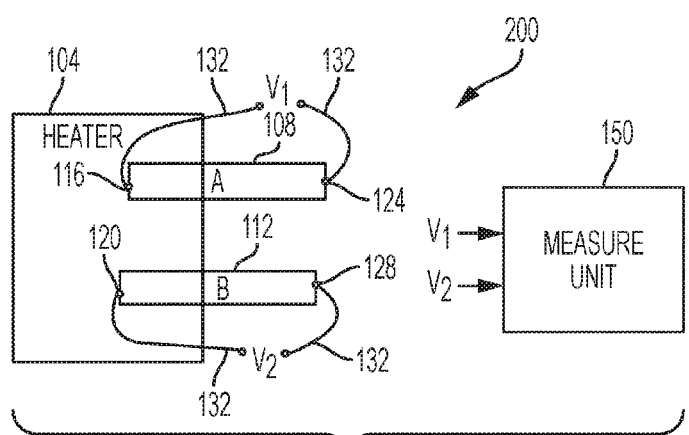
FIG. 2 is a schematic diagram of an absolute temperature sensor in accordance with another embodiment of the present invention.

Referring now to FIG. 2, there illustrated is a schematic diagram of an absolute temperature sensor 200 in accordance with another embodiment of the present invention. Similar reference numbers are used in FIG. 2 to refer to similar elements from the sensor embodiment 100 of FIG. 1. The sensor embodiment 200 of FIG. 2 differs slightly from that of FIG. 1. One potential issue with the sensor embodiment 100 of FIG. 1 is the alignment of the portions 108, 112 of material A and material B with respect to the heater 104. Generally, it is desirable that the temperatures at the first ends (the proximal ends) of the portions 108, 112 of material A and material B be equal to one another, and also that the temperatures at the second ends (the distal ends) of the portions 108, 112 of material A and material B be equal to one another. Assuming a homogeneous temperature profile of the heater 104, this means that the distances between the heater 104 and the first ends of the portions 108, 112 of material A and material B are the same. A relatively accurate alignment of the portions 108, 112 of material A and material B with respect to the heater 104 is therefore required.

To reduce as best as possible any possible errors caused by a potential misalignment of the portions 108, 112 of material A and material B with respect to each other or to the heater 104, it is desirable that both ends of both portions 108, 112 are located in a region where the temperature profile of the heater 104 is relatively flat (i.e., a small temperature change per unit length). This is the case in the region relatively close to the center of the heater 104 and in the region sufficiently far away from the heater 104.

Therefore, it is desirable to have the first (proximal) ends of the portions 108, 112 of material A and material B located relatively close to the center of the heater 104, as shown in FIG. 2. In accordance with an embodiment of the present invention, this may be achieved by placing the heater 104 on top of or abutting parts of the portions 108, 112 of material A and material B. In another embodiment, parts of the portions 108, 112 of material A and material B maybe placed on top of or abutting the heater 104. The second (distal) ends of the portions 108, 112 of material A and material B may be placed sufficiently distant from the heater 104 such that the temperature profile varies relatively little in the region where the second (distal) ends are located. This requires the portions 108, 112 of material A and material B to be sufficiently long.

Figure 3:
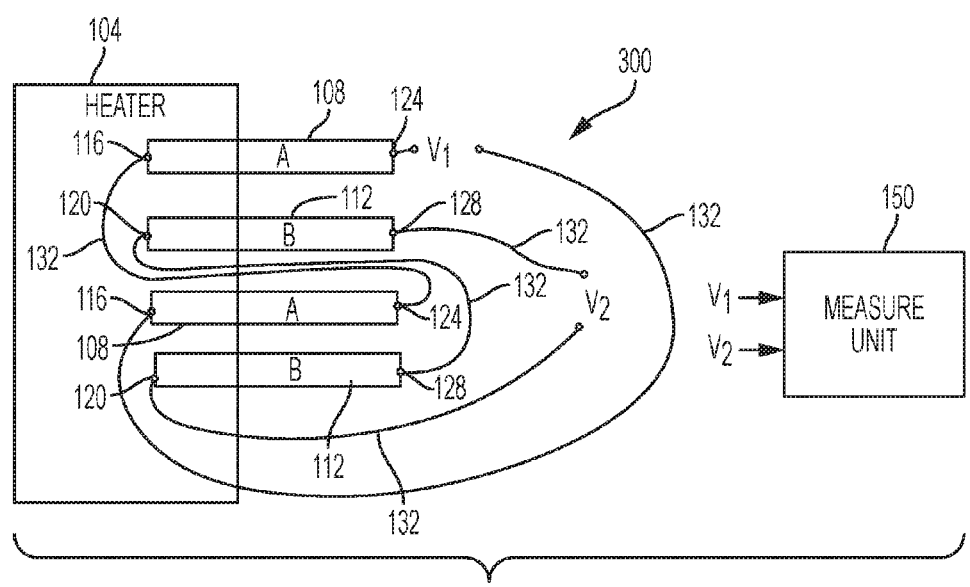
FIG. 3 is a schematic diagram of an absolute temperature sensor in accordance with yet another embodiment of the present invention.

Referring now to FIG. 3, there illustrated is a schematic diagram of an absolute temperature sensor 300 in accordance with another embodiment of the present invention.

Similar reference numbers are used in FIG. 3 to refer to similar elements from the sensor embodiments 100, 200 of FIGS. 1 and 2, respectively. One issue with the sensor embodiments 100, 200 shown in FIG. 1 and FIG. 2 is that the voltages V1 and V2 are usually relatively small in magnitude. Typical Seebeck coefficients are in the range of 10-100 microVolts/Kelvin. With a temperature difference or gradient between the first (proximal) and the second (distal) ends of the portions 108, 112 of material A and material B of less than 10K, the voltages V1 and V2 are each less than 1 milliVolt. Typically, a temperature difference of 1K-10K can be induced using a heater 104 driven with a few milliAmperes.

Determining the voltages V1 and V2 with relatively greater accuracy may be facilitated if the voltages V1 and V2 are relatively larger in magnitude. According to an embodiment of the present invention, the relative magnitude of the voltages V1 and V2 can be increased if instead of using a single portion 108, 112 of materials A and B (as in the embodiments of FIGS. 1 and 2), a multitude or plurality of portions 108, 112 of materials A and B is used and connected such that all portions 108 of material A are electrically connected in series and all portions 112 of material B are electrically connected in series, with the first end of one portion 108, 112 being connected to the second end of another portion 108, 112, respectively, as shown in FIG. 3. This allows for the voltage values of V1 and V2 to increase by a factor that corresponds to the number of portions 108, 112 of material A and material B that are connected in series. If one hundred portions of each of material A and material B are connected in series, the resulting voltages V1 and V2 are each approximately 100 milliVolts (assuming a temperature difference of 10K and a Seebeck coefficient of 100 microVolts/Kelvin) instead of only the 1 milliVolt value for each of V1 and V2 as described above with respect to use of only a single portion 108, 112 of each of material A and material B.

Regarding the choice of materials utilized in embodiments of the present invention for the heater 104, and the portions 108, 112 of material A and material B, it is desirable if the Seebeck coefficients SA and SB of materials A and B differ to a relatively great degree, and if at least one of the Seebeck coefficients SA or SB exhibits a relatively strong temperature dependence.

Typically, the temperature dependence of the Seebeck coefficient of semiconductors is larger than that of metals. Thus, in an embodiment, one choice may be to select a semiconductor (e.g., doped poly-silicon, titaniumoxynitride, etc.) as material A and a metal (e.g. cobalt, nickel, etc.) as material B. For material C, a material with a relatively small Seebeck coefficient (e.g. copper, tungsten, etc.) may be utilized.

Figure 4:
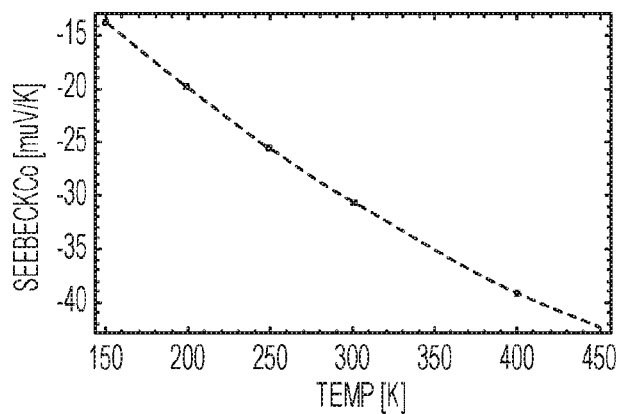
FIG. 4 is a graph of the Seebeck coefficient of cobalt in a particular temperature range.
Figure 5:
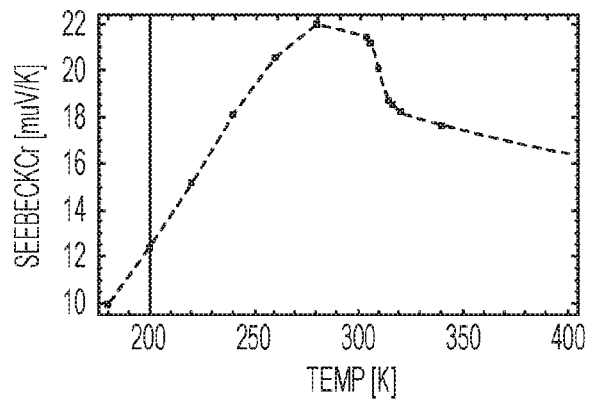
FIG. 5 is a graph of the Seebeck coefficient of chromium in a particular temperature range.

In other embodiments, two metals may be utilized as materials A and B where at least one of the metals exhibits a relatively strong temperature dependence of the associated Seebeck coefficient. As an example, cobalt (Co) may be used as material A, chromium (Cr) may be used as material B, and tungsten (having a relatively very small Seebeck coefficient) may be used as material C. The temperature dependencies of materials A and B may be inverse to each other, such that if the temperature is increased, the Seebeck coefficient of one material increases in magnitude while the Seebeck coefficient of the other material decreases in magnitude. This is the case for Co and Cr in the temperature range between 280K and 400K, as shown in FIG. 4 and FIG. 5, respectively.

Figure 6:
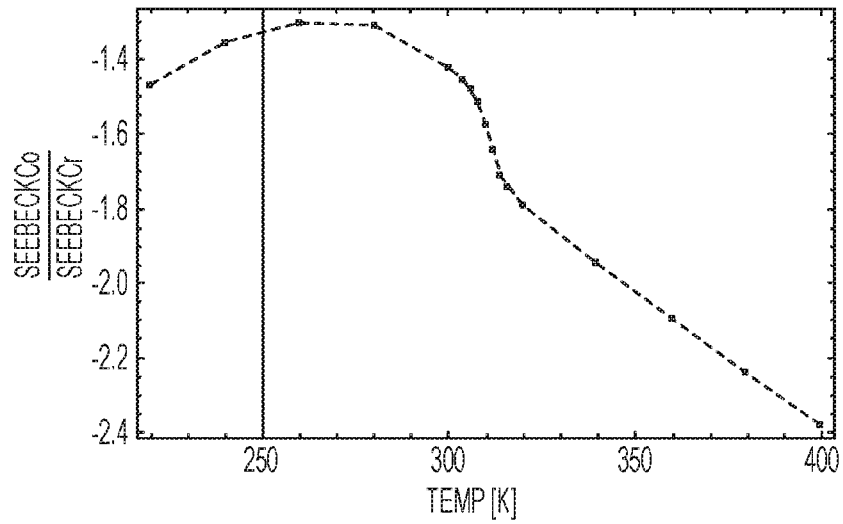
FIG. 6 is a graph of the ratio of the Seebeck coefficient of cobalt to the Seebeck coefficient of chromium in a particular temperature range.

The ratio of the Seebeck coefficients of Co and Cr is shown in FIG. 6. From that figure it can be seen that in the temperature range between 280K and 400K, the ratio R varies relatively significantly (i.e., changing from about 1.4 at 280K to 2.4 at 400K). If the ratio R of the voltages V1 and V2 can be determined with 5% accuracy, then the error in the measurement of the absolute temperature is about 5K, which may suffice for a number of applications.

Referring now to FIGS. 7 and 8, there illustrated are side and top views, respectively, of an integrated circuit 400 having an absolute temperature sensor similar to the embodiment of the absolute temperature sensor 100 shown in FIG. 1 and implemented within the IC 400, according to embodiments of the present invention. The IC 400 may comprise a substrate or substrate layer 404 and a layer 408 with micro-electronic (or integrated electronics) components formed therein. In a CMOS integrated circuit, the layer 408 is sometimes referred to as the device layer. Additionally, there may be an optional capping layer or wiring layer 412 (in CMOS).

According to an embodiment of the present invention, the device layer 408 may include a heat source or heater 416, which raises the temperature locally above the average temperature of the device 400 (or of the device layer 408), such that a temperature difference or gradient 420 (as indicted by the line with the arrowhead) arises in the vicinity of the heater 416. The heater 416 shown in FIGS. 7 and 8 may be similar to the heater 104 shown in FIG. 1.

A region 424 within the device layer 408 may include a portion 428 of the electrically conductive material A and a portion 432 of the electrically conductive material B. These portions 428, 432 may be similar to the portions 108, 112 of material A and material B illustrated in FIG. 1 and discussed hereinabove with respect to FIG. 1. This region 424 may be located within the device layer 408 such that it overlaps at least partially with a region of the temperature gradient 420. This way the end of each portion 428, 432 nearest the heater 416 (i.e., the proximal ends of the portions 428, 432) is relatively hotter in temperature as compared to the opposite end of each portion 428, 432 furthest from the heater 416 (i.e., the distal ends of the portions 428, 432). This results in a temperature difference or gradient across each of the portions 428, 432 of material A and material B, as discussed hereinabove with respect to FIG. 1.

The top view of FIG. 8 also shows the wiring connectors 436 making for electrical connections to the contact ends of each portion 428, 432 of material A and material B. These wiring connectors 436 are similar to the wiring connectors 132 of FIG. 1 in that they may comprise a third material, material C, as discussed hereinabove with respect to FIG. 1. The result is that voltages V1 and V2 may be measured, respectively, across each portion 428, 432.

As discussed hereinabove, a first electrically conductive material (material A) equipped with at least two electrical contacts (contact material is material C) and exposed to a temperature difference between the two electrical contacts will exhibit a voltage V1 between the two electrical contacts. This voltage V1 is proportional to the temperature difference between the two electrical contacts with the proportionality constant given by the difference of the Seebeck coefficient SA of the first material A and the Seebeck coefficient SC of the third material C.

Likewise, if at least two electrical contacts (of the same material C) are made to a second material B that furthermore exhibits a temperature difference between the two electrical contacts, then a voltage V2 arises between the two electrical contacts. This voltage V2 is proportional to the temperature difference between the two electrical contacts with the proportionality constant given by the difference of the Seebeck coefficient SB of the second material and the Seebeck coefficient SC of the third material C. In embodiments of the present invention, the combined Seebeck coefficients of the portion 428 of material A and the wiring contact material C 436 may have a different dependence on temperature than the combined Seebeck coefficients of the portion 432 of material B and the wiring contact material C 436.

Embodiments of the present invention described and illustrated herein have been dedicated to use in semiconductor devices such as integrated circuits. However, embodiments of the present invention are not limited as such. Other embodiments of the present invention contemplate a temperature measurement device that could be a "standalone" device, such as one that is placed on the skin of a human and used to take temperature measurements of the human. As such, this type of device may be a relatively inexpensive and high volume type of device which is used once and then discarded. Also, other embodiments of the present invention contemplate a temperature measurement device that may be integrated into a process control system for various types of industry, for example, some type of manufacturing process in which it is desired to measure the temperature of a part being manufactured and/or of the machines utilized in the manufacture of the parts.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A sensor comprising:
    a first piece of electrically conductive material having an intrinsic Seebeck coefficient, the first piece of electrically conductive material having a pair of contacts, a first one of the contacts located at a proximal end of the first piece of electrically conductive material, a second one of the contacts located at a distal end of the first piece of electrically conductive material;
    a second piece of electrically conductive material having an intrinsic Seebeck coefficient that is different than the intrinsic Seebeck coefficient of the first piece of electrically conductive material, the second piece of electrically conductive material having a pair of contacts, a first one of the contacts located at a proximal end of the second piece of electrically conductive material, a second one of the contacts located at a distal end of the second piece of electrically conductive material;
    at least one heater disposed adjacent to, or abutting, or on top of the proximal ends of the first and second pieces of electrically conductive material, the heater configured to radiate heat wherein the radiated heat causes a temperature difference to form across each of the first and second pieces of electrically conductive material, thereby causing a voltage to form across each of the first and second pieces of electrically conductive material; and
    a measure circuit that measures the voltage formed across each of the first and second pieces of electrically conductive material and determines an absolute temperature from at least the measured voltages.

2. The sensor of claim 1 wherein the first and second pieces of electrically conductive material comprise a semiconductor or a metal material.

3. The sensor of claim 1 wherein the measure circuit measures the voltage formed across each of the first and second pieces of electrically conductive material at the corresponding proximal and distal contacts of the first and second pieces of electrically conductive material.

4. The sensor of claim 1 wherein the Seebeck coefficients of the first and second pieces of electrically conductive material are independent of any dimensions of the first and second pieces of electrically conductive material.

5. The sensor of claim 1 wherein at least one of the first and second pieces of electrically conductive material has a temperature dependence on the Seebeck coefficient of the at least one of the first and second pieces of electrically conductive material.

6. The sensor of claim 1 wherein the pair of contacts of the first piece of electrically conductive material and the pair of contacts of the second piece of electrically conductive material comprise a material having a Seebeck coefficient.

7. The sensor of claim 1 wherein the voltage formed across each of the first and second pieces of electrically conductive material comprises a Seebeck voltage, wherein a ratio of the Seebeck voltage formed across the first piece of electrically conductive material and the Seebeck voltage formed across the second piece of electrically conductive material is independent of the temperature difference formed across each of the first and second pieces of electrically conductive material.

8. The sensor of claim 1 wherein the sensor is implemented within an integrated circuit.

9. A method comprising:
    providing a first piece of electrically conductive material having an intrinsic Seebeck coefficient, the first piece of electrically conductive material having a pair of contacts, a first one of the contacts located at a proximal end of the first piece of electrically conductive material, a second one of the contacts located at a distal end of the first piece of electrically conductive material;
    providing a second piece of electrically conductive material having an intrinsic Seebeck coefficient that is different than the intrinsic Seebeck coefficient of the first piece of electrically conductive material, the second piece of electrically conductive material having a pair of contacts, a first one of the contacts located at a proximal end of the second piece of electrically conductive material, a second one of the contacts located at a distal end of the second piece of electrically conductive material;
    providing at least one heater disposed adjacent to, or abutting, or on top of the proximal ends of the first and second pieces of electrically conductive material, the heater configured to radiate heat wherein the radiated heat causes a temperature difference to form across each of the first and second pieces of electrically conductive material, thereby causing a voltage to form across each of the first and second pieces of electrically conductive material; and providing a measure circuit that measures the voltage formed across each of the first and second pieces of electrically conductive material and determines an absolute temperature from at least the measured voltages.

10. The method of claim 9 wherein the measure circuit measures the voltage formed across each of the first and second pieces of electrically conductive material at the corresponding proximal and distal contacts of the first and second pieces of electrically conductive material.

11. The method of claim 9 wherein the Seebeck coefficients of the first and second pieces of electrically conductive material are independent of any dimensions of the first and second pieces of electrically conductive material.

12. The method of claim 9 wherein at least one of the first and second pieces of electrically conductive material has a temperature dependence on the Seebeck coefficient of the at least one of the first and second pieces of electrically conductive material.

13. A sensor comprising:
a first piece of electrically conductive material having an intrinsic Seebeck coefficient, the first piece of electrically conductive material having a pair of contacts, a first one of the contacts located at a proximal end of the first piece of electrically conductive material, a second one of the contacts located at a distal end of the first piece of electrically conductive material;
a second piece of electrically conductive material having an intrinsic Seebeck coefficient that is different than the intrinsic Seebeck coefficient of the first piece of electrically conductive material, the second piece of electrically conductive material having a pair of contacts, a first one of the contacts located at a proximal end of the second piece of electrically conductive material, a second one of the contacts located at a distal end of the second piece of electrically conductive material;
at least one heater disposed adjacent to, or abutting, or on top of the proximal ends of the first and second pieces of electrically conductive material, the heater configured to radiate heat wherein the radiated heat causes a temperature difference to form across each of the first and second pieces of electrically conductive material, thereby causing a voltage to form across each of the first and second pieces of electrically conductive material, wherein the voltage formed across each of the first and second pieces of electrically conductive material is indicative of an absolute temperature value provided by the sensor.

14. The sensor of claim 13 further comprising:
a plurality of the first pieces of the electrically conductive material, the plurality the first pieces of electrically conductive material being connected in series; and
a plurality of the second pieces of electrically conductive material, the plurality of the second pieces of electrically conductive material being connected in series.

15. The sensor of claim 13 wherein the first and second pieces of electrically conductive material comprise a semiconductor or a metal material.

16. The sensor of claim 13 wherein the Seebeck coefficients of the first and second pieces of electrically conductive material are independent of any dimensions of the first and second pieces of electrically conductive material.

17. The sensor of claim 13 wherein the voltage formed across each of the first and second pieces of electrically conductive material comprises a Seebeck voltage, wherein a ratio of the Seebeck voltage formed across the first piece of electrically conductive material and the Seebeck voltage formed across the second piece of electrically conductive material is independent of the temperature difference formed across each of the first and second pieces of electrically conductive material.

18. The sensor of claim 13 wherein the sensor is implemented within an integrated circuit.

19. The sensor of claim 13 further comprising a measure circuit that measures the voltage formed across each of the first and second pieces of electrically conductive material and determines the absolute temperature value provided by the sensor from at least the measured voltages.

20. The sensor of claim 19 wherein the measure circuit measures the voltage formed across each of the first and second pieces of electrically conductive material at the corresponding proximal and distal contacts of the first and second pieces of electrically conductive material.

* * * * *